United States Patent [19]

Hochreuther et al.

[11] Patent Number: 4,860,901

[45] Date of Patent: Aug. 29, 1989

[54] HOUSING WITH A FLEXIBLE SHOCK PROTECTOR FOR A PORTABLE MEASURING INSTRUMENT

[75] Inventors: Karl Hochreuther; Edmund Reichler, both of Nürnberg, Fed. Rep. of Germany

[73] Assignee: Brown, Boveri & Cie AG, Mannheim, Fed. Rep. of Germany

[21] Appl. No.: 33,479

[22] Filed: Apr. 1, 1987

[30] Foreign Application Priority Data

Apr. 3, 1986 [DE] Fed. Rep. of Germany ....... 3611067

[51] Int. Cl.⁴ ............................................. B65D 81/08
[52] U.S. Cl. ..................................... 206/586; 73/431; 206/305; 206/591
[58] Field of Search ............... 206/305, 320, 521, 523, 206/588–591, 372, 373, 586; 190/102, 111, 113; 150/52 R; 73/431, 432.1, 866.5

[56] References Cited

U.S. PATENT DOCUMENTS

| | | |
|---|---|---|
| 280,674 | 9/1985 | Nelson . |
| 1,171,678 | 2/1916 | Trotter ............................ 190/102 X |
| 2,643,546 | 6/1953 | Boehm . |
| 2,712,113 | 6/1955 | Triplett ................................ 73/431 |
| 2,988,125 | 6/1961 | Reynolds ........................ 190/111 X |
| 3,665,991 | 5/1972 | Gillemot et al. ................. 73/431 X |
| 3,812,939 | 5/1974 | Pelletier ............................... 190/113 |
| 3,946,613 | 3/1976 | Silver .................................. 73/431 X |
| 4,114,761 | 9/1978 | Kleiner .................................. 206/591 |
| 4,303,188 | 12/1981 | Calabrese .......................... 206/372 X |
| 4,322,835 | 3/1982 | Ernst et al. ....................... 206/305 X |
| 4,386,702 | 6/1983 | Schultz et al. ......................... 206/523 |
| 4,450,963 | 5/1984 | Sieber .................................... 206/521 |
| 4,458,813 | 7/1984 | Tushinskly et al. ................. 206/320 |
| 4,557,383 | 12/1985 | Arnoux et al. ....................... 206/521 |
| 4,669,001 | 5/1987 | Thrush ............................ 206/320 X |

FOREIGN PATENT DOCUMENTS

| | | |
|---|---|---|
| 0187667 | 7/1986 | European Pat. Off. . |
| 1157697 | 11/1963 | Fed. Rep. of Germany . |
| 7129054 | 7/1971 | Fed. Rep. of Germany . |
| 2329466 | 12/1974 | Fed. Rep. of Germany . |
| 2748431 | 2/1979 | Fed. Rep. of Germany . |
| 2836679 | 3/1980 | Fed. Rep. of Germany . |
| 3113497 | 11/1982 | Fed. Rep. of Germany . |
| 3232258 | 5/1983 | Fed. Rep. of Germany . |

OTHER PUBLICATIONS

"Highlights for the home laboratory" Funkschau, vol. 26, 1985; pp. 42–46.
"Electronics Review" Electronics, Jun. 24, 1976, pp. 42 and 44.
"Mesucora-Physique 85" Measures, Nov. 18, 1985; p. 185.
"Mesucora-Physique 85" Measures, Jan. 20, 1986, p. 99.
"New: Digitherm 2 and Digitherm 3 temperature Measuring device with digital reading" leaflet information.

*Primary Examiner*—Stephen Marcus
*Assistant Examiner*—Bryon Gehman
*Attorney, Agent, or Firm*—Herbert L. Lerner; Laurence A. Greenberg

[57] ABSTRACT

A housing for a portable measuring instrument includes inherently stable supporting housing parts formed of hard plastic, the supporting housing parts including a front and a back with relatively long right and left sides, relatively short sides and two opposite outer edges, an operating surface on the front, a display on the front, and operating elements on the front; and a flexible, frame-like shock protector in the form of two side parts formed of soft plastic integrated in the housing, the side parts protruding beyond all of the sides of the supporting housing parts and extending at the right and left sides between the front and back, the side parts being permanently secured to the housing parts, and beads each being disposed at a respective one of the outer edges of the front, for protecting the front including the display and the operating elements, the beads protruding along the long sides beyond the front defining a recessed grip along with the operating surface, for accommodating the thumb of an operator of the instrument on the long side next to the operating elements.

12 Claims, 10 Drawing Sheets

HOUSING WITH A FLEXIBLE SHOCK PROTECTOR FOR A PORTABLE MEASURING INSTRUMENT

The invention relates to a housing for a portable measuring instrument, with inherently stable supporting housing parts made of hard plastic and an elastic or flexible frame-like shock protector made of soft plastic that is self-retaining on the housing parts, protrudes beyond the housing parts on all sides and has a bead formed on two opposite outer edges at the front, the bead protecting the front, especially display and operating elements.

Professional measuring instruments that are used in assembly work and at construction sites must withstand rough treatment without any loss in function. Folding instruments have therefore been constructed in which all of the sensitive operating elements as well as the display come to rest in the interior of the housing, as soon as the two housing parts are folded together. However, the protection afforded by folding the housing parts can only come into play while the measuring instrument is inoperative, or in other words while the instrument is being carried in a kit.

It is possible to provide protection against shocks and impact, that is effective when the measuring instrument is in use as well, by using a conventional rubber-like body into which the measuring instrument can be inserted, in such a way that it forms a frame-like casing. The front of the measuring instrument must be kept clear. Therefore, if such a shock protector protrudes beyond the front of the measuring instrument with a suitably raised bead at two opposite sides, then the bead will absorb a shock that occurs if the measuring instrument drops on the front thereof.

Furthermore, prior art frame-like shock protectors are also disadvantageous because they are very heavy and considerably increase the volume of the measuring instrument. This has tempted mechanics, who prefer small and lightweight tool kits, to remove the shock protector and leave it at home. In that case the shock protector can not only no longer perform its task but could even be lost, because it is separated from the measuring instrument.

It is accordingly an object of the invention to provide a housing for a portable measuring instrument, which overcomes the hereinafore-mentioned disadvantages of the heretofore-known devices of this general type and which affords protection for the supporting housing parts and operating elements that are sensitive to shock, with the simplest possible means. The shock protector should be particularly lightweight and should not bring about any substantial increase in the volume of the instrument, so that there will be no need for dispensing with the protection of the housing. At the same time, the housing should be able to be held comfortably in one hand, in an ergonometrically favorable position, without hiding the display of the operating elements.

With the foregoing and other objects in view there is provided, in accordance with the invention, a housing for a portable measuring instrument, comprising inherently stable supporting housing parts formed of hard plastic, the supporting housing parts including a front and a back with relatively long right and left sides, relatively short sides and two opposite outer edges, an operating surface on the front, a display on the front, and operating elements on the front; and a flexible, elastic or resilient frame-like shock protector in the form of two side parts formed of soft plastic integrated in the housing, the side parts protruding beyond all of the sides of the supporting housing parts and extending at the right and left sides between the front and back, the side parts including means for permanently securing the side parts to the housing parts, and beads each being disposed at a respective one of the outer edges of the front, for protecting the front including the display and the operating elements, the beads protruding along the long sides beyond the front defining a recessed grip along with the operating surface, for accommodating the thumb of an operator of the instrument on the long side next to the operating elements.

Because the shock protector is integrated into the housing, it is permanently connected with it, which therefore precludes removal or loss of the shock protector. Contrary to the prior art structures, the front is not surrounded on all four sides by a bead protruding beyond it, but instead two side parts of soft plastic are secured on the long sides on the supporting housing parts and protrude beyond the operating surface in such a way that a recessed grip is produced between the two side parts. In this recessed grip, there is room for one thumb on the long side next to the operating elements. As a result, the measuring instrument can be comfortably held in one hand. Other than the two long sides of the measuring instrument that are located between the front and back and are completely covered by the two side parts, all of the remaining sides of the housing remain substantially free. In particular, the back remains completely accessible, which is also an advantage because the batteries, for instance, can be changed without having to remove the shock protector.

In accordance with another feature of the invention, the back has profiled depressions formed therein parallel to the two side parts in the vicinity of the outer edges, the depressions having profiles adapted to test prods to be placed therein, and including flexible clamping straps protruding from the two side parts for fixing test prods placed thereon in the profiled depressions. A conventional test prod takes the form of a stylus, the tip of which is separated from the hand region by a protecting ring. The profiled depression also receives this protecting ring, which at the same time fixes the location of the test prod in the longitudinal direction. Flexible clamping straps beginning at the two side parts clamp the test prods on the housing. The two test prods can thus be secured directly to the housing in order to transport the measuring instrument or to store it in an instrument cabinet.

In accordance with a further feature of the invention, the side parts have inner surfaces facing toward the housing parts, and including at least one retaining plug integrally formed on each of the inner surfaces, the retaining plugs being engaged and anchored in retaining holes formed in the housing parts.

The anchoring of the two side parts, which are preferably mirror-symmetrically and identical, is carried out by means of retaining heads. Therefore, in accordance with an added feature of the invention, the supporting housing parts are in the form of upper and lower housing parts with abutting edges, the retaining holes for receiving the retaining plugs are formed in the vicinity of the abutting edges between the upper and lower housing parts, and the retaining plugs include retaining heads for penetrating the retaining holes when the upper and lower housing parts are spaced apart, the retaining heads being fixed in position when the housing is closed. This assures not only easy assembly but also simple disassembly.

Assembly is facilitated if, in accordance with an additional feature of the invention, the side parts have handle holes formed therein, and including a retaining part formed of flexible hard plastic having detent ribs formed thereon penetrating the side parts in the vicinity of the handle holes and being anchored in retaining holes formed in the housing parts. In accordance with yet another feature of the invention, the retaining element includes a cover plate having a lower surface on which the detent ribs are disposed and an upper surface having gripping nubs formed thereon, the cover plate being form-lockingly engaged in a depression formed in one of the side parts.

When the side parts are assembled, the supporting housing parts can rest rigidly on one another, so that with the side parts mounted, the retaining parts need merely be pressed into their detent position.

In order to attain a form-locking contact between the side parts and the supporting housing parts, fixation ribs and/or fixation grooves are formed on the supporting housing parts in the vicinity of both the front and the back, corresponding to complementary fixation grooves and/or fixation ribs of the side parts. The bead formed by the side parts on the front is rounded in the plane of the operating surface in such a way that it is largely form-lockingly flush with it. This not only improves the overall appearance in esthetic terms, but it is also no longer necessary for the thumb to rest on edges that would make it uncomfortable to hold the instrument for a long period of time in this way. However, in order to prevent the relatively wide bead from being able to unnecessarily restrict the operating surface, recesses are provided in the bead in the vicinity of the operating button of the measuring range switch, and preferably also in the vicinity of the display and of the jacks.

A gradual transition between the bead and the operating surface, in other words without sharp edges, is facilitated by providing that part of the front, where the side parts rest, is indented relative to the operating surface. The turning knob of the measuring range switch is disposed approximately in the center of the operating surface and the toggle of the turning knob protrudes beyond the turning base of this knob. As a result, not only can the measuring instrument be held with one hand but at the same time the measuring range switch can be operated with the thumb of the same hand.

In accordance with yet a further feature of the invention, the back has guide depressions formed therein adjoining the profiled depressions, each of the guide depressions being parallel to a respective one of the two side parts, for guiding a measuring line wound on the long side with a length being adapted to the circumference of the housing and for winding the line in a secure and non-slipping manner with the test prod in its detent position. Therefore, not only the test prods but also the measuring lines connected to them can be secured to the housing.

In accordance with yet an added feature of the invention, the clamping straps protrude beyond the housing parts on the back or they protrude equally as far as the housing parts on the back, providing a foot for the housing to stand on.

In accordance with yet an additional feature of the invention, there is provided a sliding cap formed on the back between the profiled depressions, the sliding cap having an end and sliding rails extending parallel to the long sides, a sliding drawer opening toward the front when the sliding cap is pulled out, the sliding drawer coming to rest beneath the display when the sliding cap is closed, and a housing drawer on the end of the sliding cap opposite the sliding drawer being uncovered when the sliding cap is pulled out to the length of the sliding drawer, the housing drawer having an opening being accessible from the back. This is possible because the back of the housing is free.

Both drawers serve to receive parts that need to be replaced relatively often. Preferably, the sliding drawer serves to receive a battery, and the housing drawer serves to receive a fuse. Therefore, in accordance with still another feature of the invention, one of the drawers includes means for receiving at least one battery and the other of the drawers includes means for receiving at least one fuse, the sliding cap being in the form of a closure plate in the vicinity of the housing drawer, and including a window disposed in the sliding cap opposite the fuse receiving means. The window is provided so that without opening the housing it can be seen from the outside whether a fuse might be burned through.

According to the invention, the free back of the housing can be used in such a way that a two-legged angle element is secured to the sliding cap at the upper end of the housing, that is in the vicinity of the display. One leg of the angle element is retained in a guide pocket protruding into the interior of the housing and the other leg extends over a large surface area parallel to the back of the housing in the direction of lower end thereof. The angle element thus serves as a hook, which enables the measuring instrument to be suspended on a jacket or coat pocket if neither hand is free for holding the measuring instrument. A retaining hole provided in the outer leg of the angle element also permits the measuring instrument to be hung on a hook on the wall. In order to prevent the angle element from getting in the way when the measuring instrument is resting on its back on a work table, the angle element is insertable into the guide pocket. When it is pulled out, it locks into a final position which prevents easy retraction of the angle element.

It is advantageous to not only be able to lay down and hang up the measuring instrument but also to stand it up, because this generally provides for a better viewing angle. Therefore, in accordance with a concomitant feature of the invention, the sliding cap includes an outer surface, and there is provided a support strap having an upper end outwardly rotatably secured to the outer surface of the sliding cap, a support rib limiting the outward pivot angle of the support strap, the support strap coming to rest on the back in an indentation when pivoting inward, and snap elements locking the support strap when pivoting inward.

In order to prevent the window in the lower portion of the sliding cap from being covered by the support strap, the support strap is provided with an opening. When the measuring instrument is held with one hand, the thumb gains a hold in a recessed grip behind the bead of one side part, in the manner described above. The fingers of the same hand are then supported on the back of the measuring instrument. In order to furnish a good hold for the fingers as well, a finger recess is formed parallel to the two side parts in the middle of the support strap and gripping nubs are located in the recess. The pivotable part of the support strap is connected to the support rib by a hinge-like cutout of material. The support rib is part of a retaining plate, which is secured to the sliding cap by guide rails and locks on the cap after insertion.

The sliding cap itself is also locked to the housing in detent fashion in the closed state and this locking can only be overcome by using a tool. This ensures that the housing will not be opened by mistake, which would make it easier to gain access to parts of the instrument that carry voltage. The locking is overcome by means of an access hole, which is formed on the back of the supporting housing parts and is covered by the support strap.

An insulating partitioning shell inserted into the housing assures that at least parts of the housing interior that carry voltage are covered in the vicinity of the housing drawer, so that even when the sliding cap is opened they do not cause any immediate danger.

Other features which are considered as characteristic for the invention are set forth in the appended claims.

Although the invention is illustrated and described herein as embodied in a housing for a portable measuring instrument, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Referring now to the figures of the drawings in detail and first, particularly, to FIGS. 1-4 thereof, there is seen a housing substantially formed of an upper supporting housing part 1a, a lower supporting housing part 1b and side parts 3. The side parts 3 are permanently connected to the supporting housing parts 1 and can be detached therefrom only when the housing is disassembled. The side parts extend on both lateral surfaces on the long sides of the supporting housing parts 1 between the front 99 and back 95.

The side parts 3 are constructed in such a way that they protrude beyond the supporting housing parts 1 on all six sides and thus can absorb shocks that originate over relatively wide surfaces, such as if the instrument falls onto a storage table or onto the floor. The two side parts protrude beyond the front 99 with beads 30, which terminate toward an operating surface 10 in such a way that they merge smoothly with the operating surface, without forming a step. The beads 30 produce a recessed grip between the two side parts 3 on the front 99, which a thumb can engage on the long sides toward the side parts 3. The thumb can gain a good hold on the beads 30, while the other fingers of the same hand rest on the back 95 of the housing. At the same time, it is possible to move the thumb in such a way that it can actuate a turning knob 92, mounted on the center of the operating surface and belonging to a measuring range switch. In order to facilitate this operation, the turning knob 92 is equipped with a toggle 91, which protrudes beyond a turning base 90 and thus forms a long lever. Other operating elements 97 are disposed on the operating surface 10 between a display 98 and jacks 93.

Figure 35:
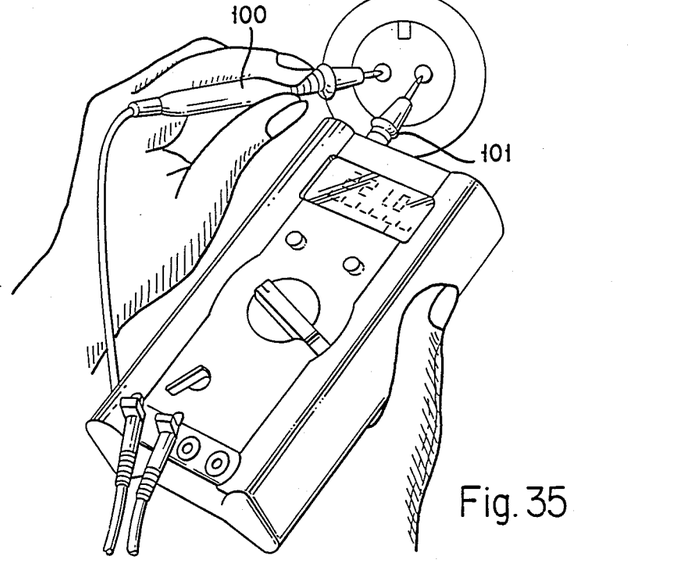
FIG. 35 is a perspective view of the front of the measuring instrument held by the hands of an operator of the device.
Figure 36:
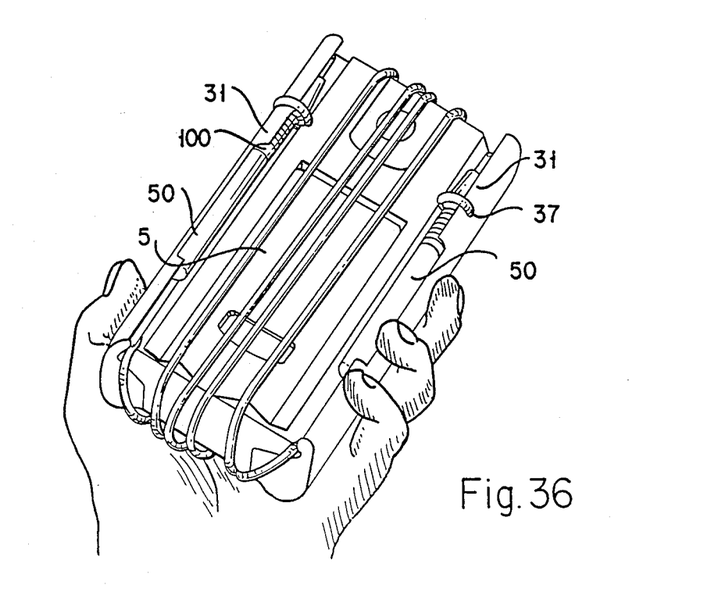
FIG. 36 is a perspective view of the back of the measuring instrument with the clamping straps.

The shape of the back of the housing 1, 3 is shown in FIGS. 3 and 4 and FIGS. 5–8 show details of one side part 3. Profiled depressions 11 are recessed in the back 95 of the supporting lower housing part 1b with respect to the side part 3, in the vicinity of the outer edges, on the long sides; the depressions enable one test prod to be placed in each of them. As seen in FIGS. 35 and 36, each test prod 100 is then retained in its position by means of clamping straps 31 formed on the back on the side part 3. An annular recess 37 is provided in the clamping strap 31 to accommodate a protecting ring 101 formed on the test prod and a grasping recess 36 is provided in the clamping strap 31 to facilitate grasping with one hand when removing the test prod.

Figure 1:
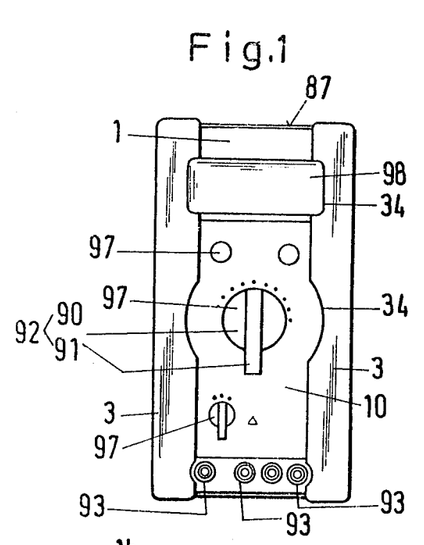
FIG. 1 is a fragmentary top-plan view of a measuring instrument housing according to the invention.
Figure 2:
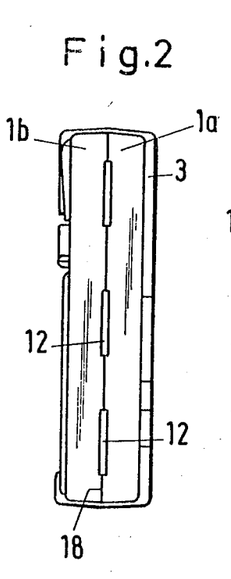
FIG. 2 is a side-elevational view of the housing, with the side part removed.
Figure 3:
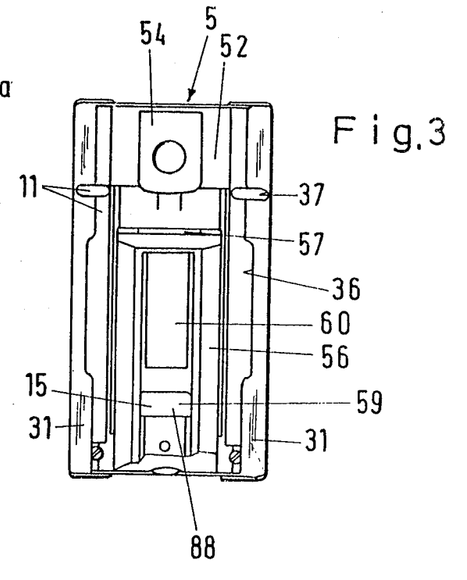
FIG. 3 is a bottom-plan view of the housing.
Figure 4:
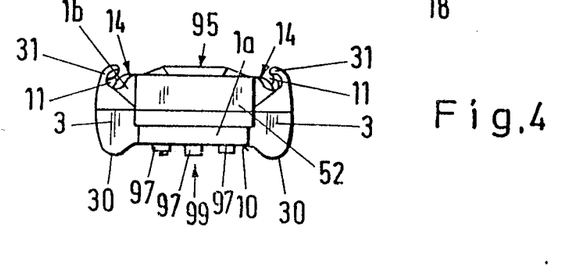
FIG. 4 is an elevational view of the end surface of the housing.
Figures 5, 6:
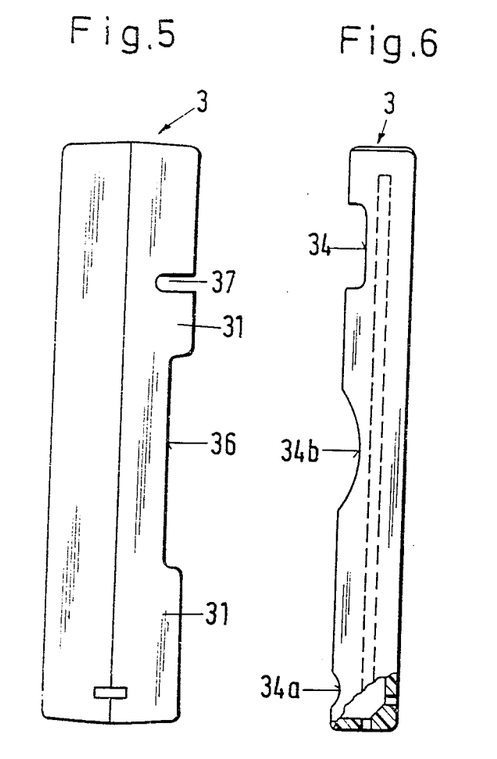
FIG. 5 is an elevational view of the outside of a side part.
FIG. 6 is another elevational view of the side part of FIG. 5, which is rotated through 90 degrees.

A guide depression 14 is formed on the back 95 of the housing 1, 3, parallel to each of the two side parts 3, adjoining the profiled depressions 11. The guide depressions guide a measuring line wound on the long side. The length of the measuring line is adapted to the circumference of the housing in such a way that with the test prod in its detent position, the line is wound in a secure and non-slipping manner.

The side part 3 is also provided with other recesses 34a, b, c in the vicinity of the front, which widen the operating surface in the vicinity of the turning knob 92 that is part of the measuring range switch and also afford more space for the display 98 and the jacks 93.

The side parts 3 are secured on the supporting housing parts 1a, 1b with the aid of retaining plugs 32 having retaining heads 33 formed on the free ends thereof, which are anchored in retaining holes 12 in the supporting housing parts 1. The retaining holes 12 are located in the vicinity of abutting edges 18 of the two supporting housing parts 1, so that they become larger as soon as the two housing parts are moved and spaced apart from one another. The relatively wide retaining heads 33 can then penetrate the retaining holes 12 and become locked in position when the housing parts are closed.

Figure 7:
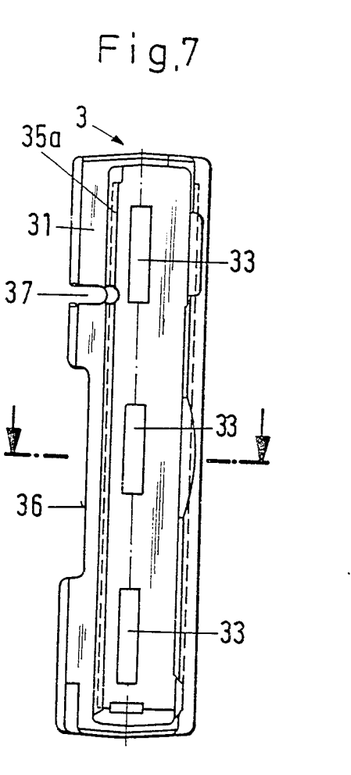
FIG. 7 is an elevational view of the inside of a side part.
Figure 8:
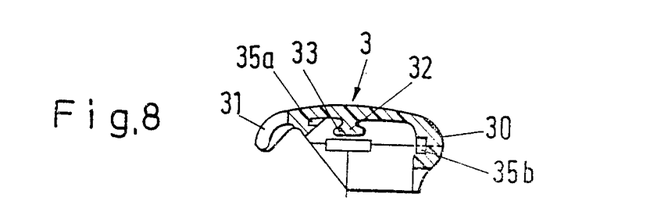
FIG. 8 is a cross-sectional view of a side part, taken along the section line of FIG. 7, in the direction of the arrows.

Fixation grooves and/or fixation ribs 35a, 35b are also formed on the inside of the side parts 3, corresponding with complementary fixation ribs and/or fixation grooves on the front 99 and back 95 of the supporting housing parts 1. As a result, the side parts 3 are retained in a form-locking manner on the fixed housing parts 1 and cannot be ripped off. A form-locking connection is one which is formed by virtue of the shape of the parts, as opposed to a form-locking connection requiring external force.

An alternative to the one-piece construction of the side part 3 of FIGS. 5–8, is shown in FIGS. 27–34. In the side parts 3 illustrated in FIGS. 27–34, handle holes 39 and a retaining part 4 with detent ribs 41 are used instead of the retaining plugs. The detent ribs 41 which are secured to a cover plate 43, penetrate the handle holes 39 and are locked in the retaining holes 12 in the supporting housing parts 1. The cover plate 43 is accommodated in a depression 38 in the side part 3. Two hooks on the two ends of the cover plate 43 secure the side part 3 against being loosened by force. The hooks may be constructed as breakaway elements,, in order to reveal any use of force. The cover plate 43 is also provided with gripping nubs 42.

Figure 9:
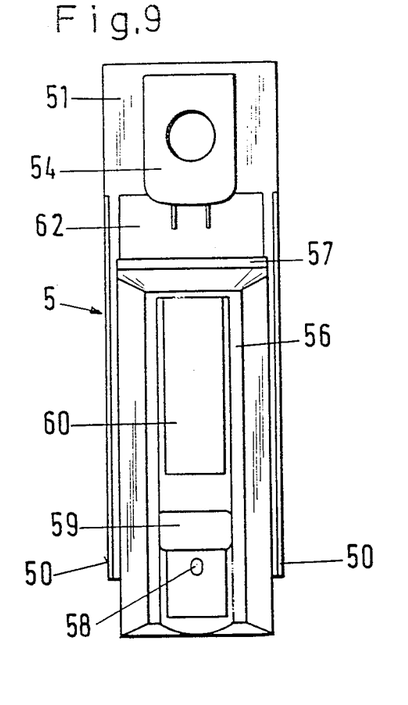
FIG. 9 is a top-plan view of a sliding cap mounted and secured on the back of the housing.
Figure 10:
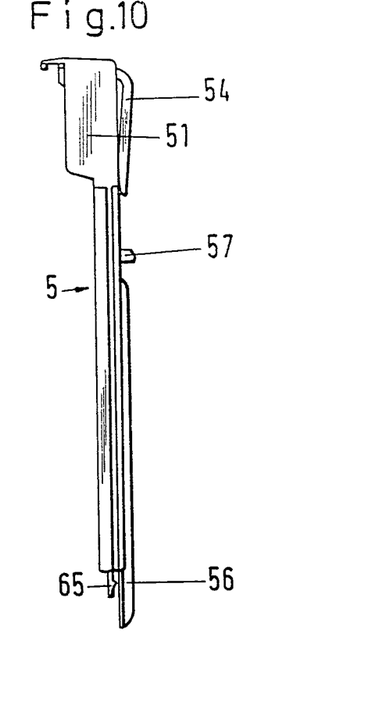
FIG. 10 is a side-elevational view of the sliding cap.
Figure 11:
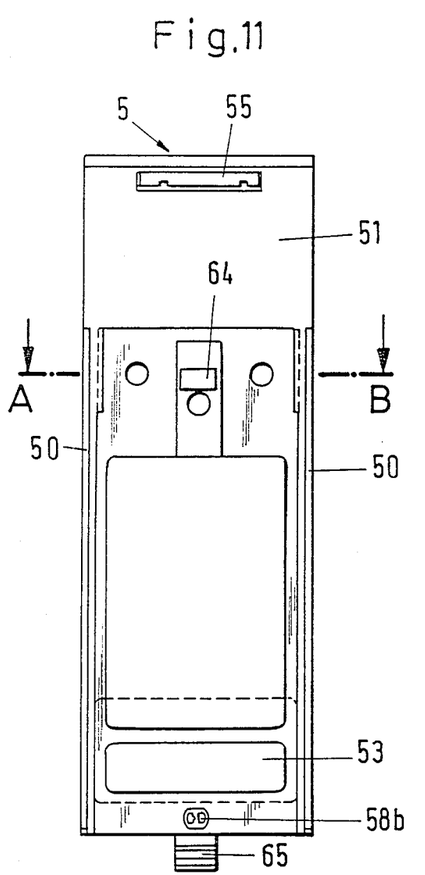
FIG. 11 is a top-plan view of the sliding cap, without assembly elements.
Figure 12:
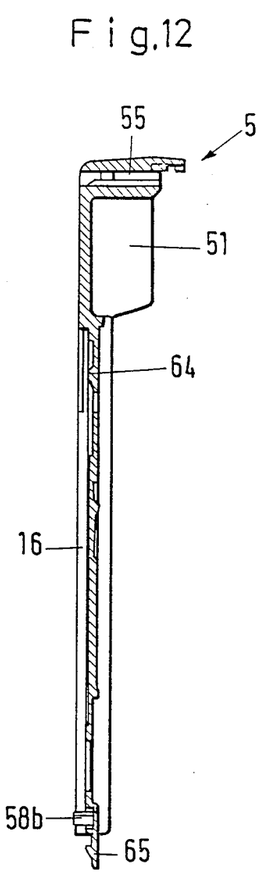
FIG. 12 is side-elevational view of the sliding cap, without assembly elements.
Figure 13:
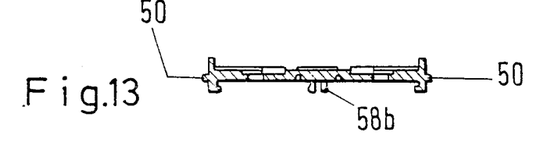
FIG. 13 is a cross-sectional view of the sliding cap taken along the line A-B in FIG. 11, in the direction of the arrows.

As shown in FIGS. 11–13, a sliding cap 5 is secured with the aid of sliding rails 50 on the supporting housing lower part 1b, on the back 95 of the housing 1, 3 between the side parts 3. The upper end of the sliding cap 5 has a sliding drawer 51, which opens toward the front 99 when the sliding cap 5 is pulled out. This sliding drawer 51 is suitable for the receiving a battery for supplying current to the measuring instrument. When the sliding cap 5 is pulled out, it simultaneously opens a housing drawer 15, in which a fuse for protecting the measuring instrument is accommodated. In order to make it possible to see from the outside whether or not the fuse has burned through in the event of a malfunction, the sliding cap 5, which in this portion is constructed as a closure plate 52, is provided with a window 53. FIGS. 11–13 show details of the sliding cap 5 which are not apparent in FIGS. 9 and 10 because of the other components secured thereto. A guide pocket 55 which is formed between the sliding drawer 51 and the upper end surface of the sliding cap 5, is engaged by one leg 54a of an angle element 54. The other leg 54b of the angle element 54 is parallel to the back 95 of the housing 1, 3 and points in the direction toward the lower end. As a result, the angle element 54 can serve as a hang up hook, which can be secured to a coat or jacket pocket. A retaining hole 54c provided in the other leg 54b also permits the measuring instrument to be hung up on a hook or nail.

Figure 14:
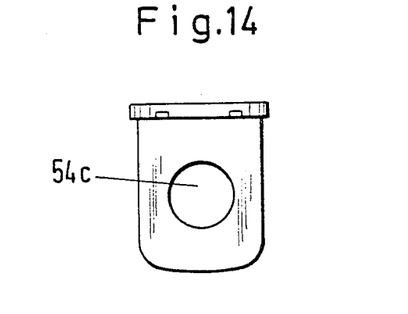
FIG. 14 is a top-plan view of an angle element secured to the sliding cap.
Figure 15:
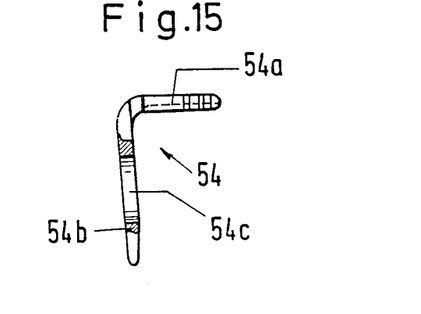
FIG. 15 is a partly sectional, side-elevational view of the angle element.
Figure 16:
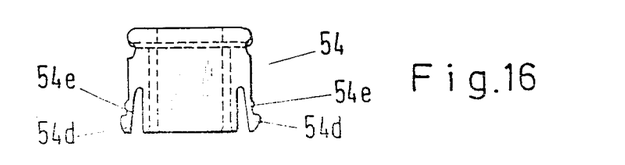
FIG. 16 is an elevational view of the other leg of the angle element.
Figure 17:
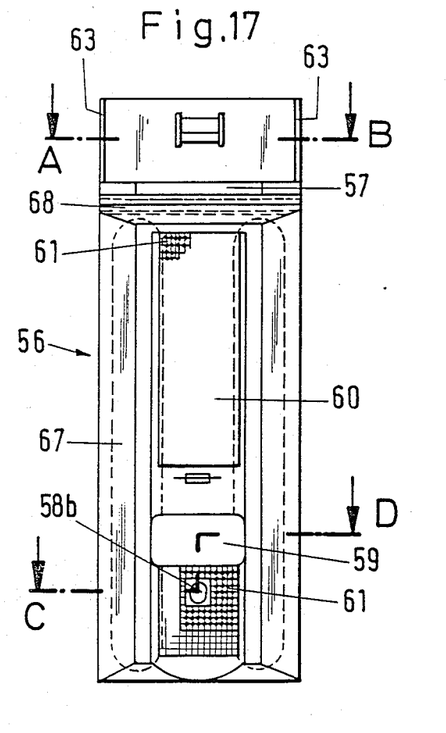
FIG. 17 is a top-plan view of a support strap secured to the sliding cap.
Figure 18:
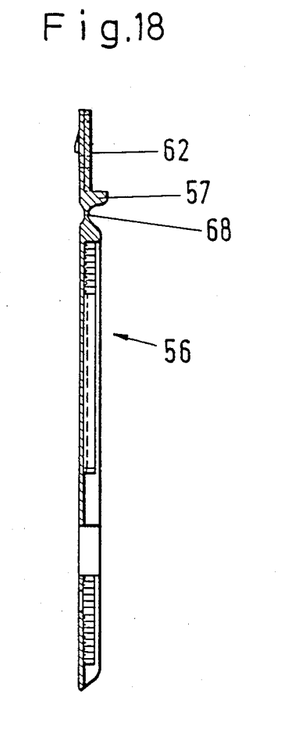
FIG. 18 is a partly cross-sectional, side-elevational view of the support strap.
Figure 19:
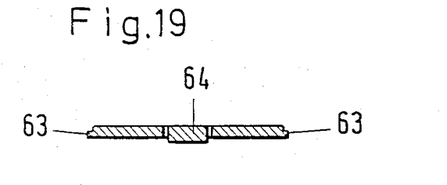
FIG. 19 is a cross-sectional view of the support strap, taken along the line A-B in FIG. 17, in the direction of the arrows.
Figure 20:
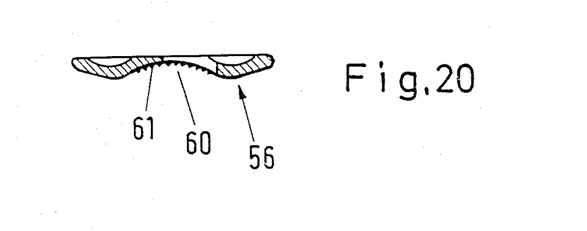
FIG. 20 is a cross-sectional view of the support strap, taken along the line C-D in FIG. 17, in the direction of the arrows.
Figure 21:
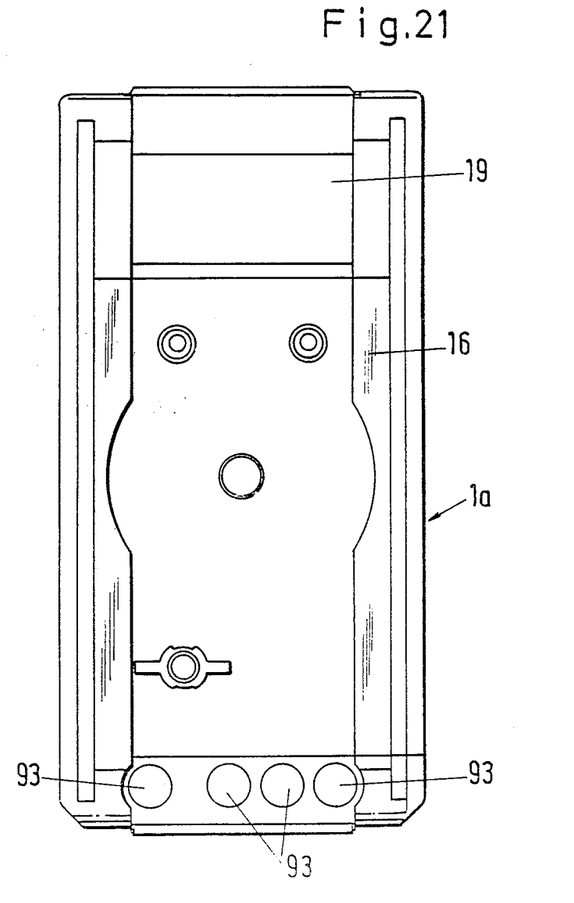
FIG. 21 is a top-plan view of the upper supporting housing part.
Figure 22:
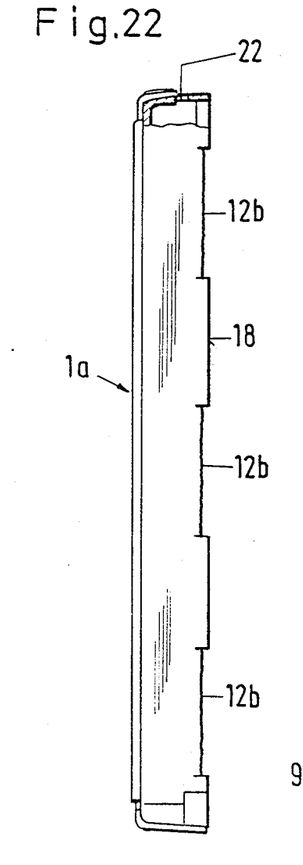
FIG. 22 is a side-elevational view of the upper supporting housing part.
Figure 23:
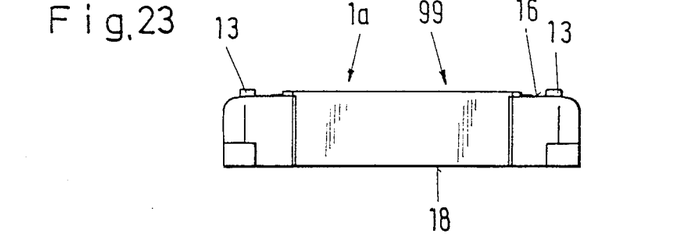
FIG. 23 is an elevational view of the lower housing edge of the upper supporting housing part.

Details of the angle element 54 shown in FIGS. 14–16 include other detent hooks 54d, with which the angle element is anchored inside the guide pocket 55. Detent knobs 54e lock the angle element 54 in its pulled-out position, so that it can only be pushed back into the guide pocket 55 with a suitable exertion of force.

FIGS. 17–20 show details of a support strap 56 secured to the sliding cap 5. A retaining plate 62 secured to the sliding cap 5 by guide rails 63 and detent elements 64 is connected through a hinge rib 68 to a pivot element 67 of the support strap 56. The pivot element 67 can be pivoted about the hinge rib 68 far enough so that it meets a support rib 57 secured to the retaining plate 62. The pivot angle is large enough to ensure that the support strap 56 provides secure support for the measuring instrument disposed thereon.

Since the support strap 56 is located in the middle of the back of the housing 1, 3, in other words where the fingertips rest when the measuring instrument is held in one hand, it is provided with a finger recess 60, in which gripping nubs 61 may also be provided. This practically precludes unintentional slipping of the fingers. In the vicinity of the window 53 provided in the sliding cap 5, the support strap 56 has an opening 59, which provides a view of the fuse. Snap elements 58a, 58b lock the support strap 56 in the rest position on the sliding cap 5.

The supporting housing parts 1 shown in FIGS. 22–26 form a supporting framework, not only for the two side parts 3 but for all the other parts as well. The supporting upper housing part 1a is provided in the front 99 thereof with a display cutout 19, behind which a display unit forming the display 98 is mounted. Jack holes are provided on the lower end of the upper housing part 1a, opposite the display 98. Fixation ribs 13 which are integrally formed in the vicinity of the outer edges on both sides of the operating surface 10, engage fixation grooves 35b in the side parts 3. An indentation 16 is located between the fixation ribs 13 and the operating surface 10, in order to assure a virtually continuous transition from the side part to the operating surface 10.

Figures 24, 25, 26:
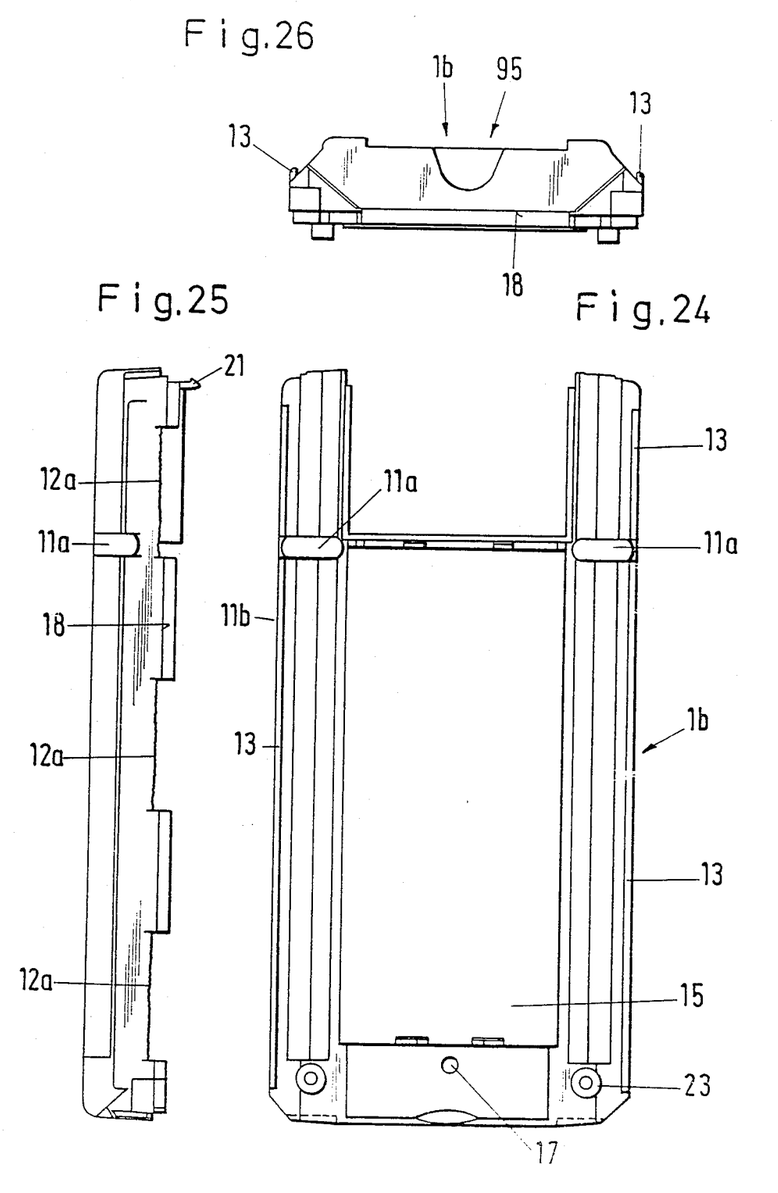
FIG. 24 is a bottom-plan view of the lower supporting housing part.
FIG. 25 is a side-elevational of the lower supporting housing part.
FIG. 26 is an elevational view of the lower housing side of the lower supporting housing part.
Figure 27:
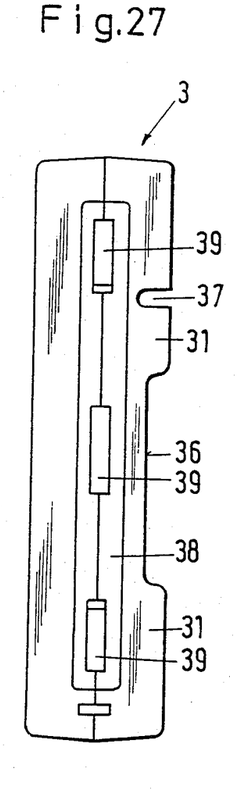
FIG. 27 is a side-elevational view of a side part with handle holes, as seen from the outside.
Figure 28:
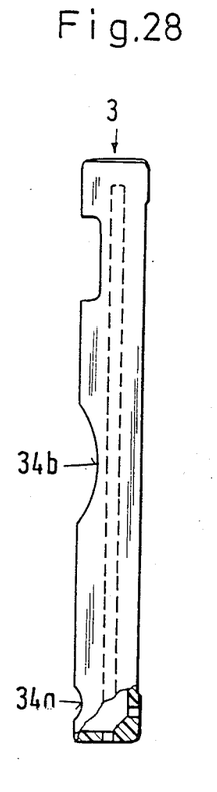
FIG. 28 is an elevational view of the side part of FIG. 27, rotated through 90 degrees.
Figure 29:
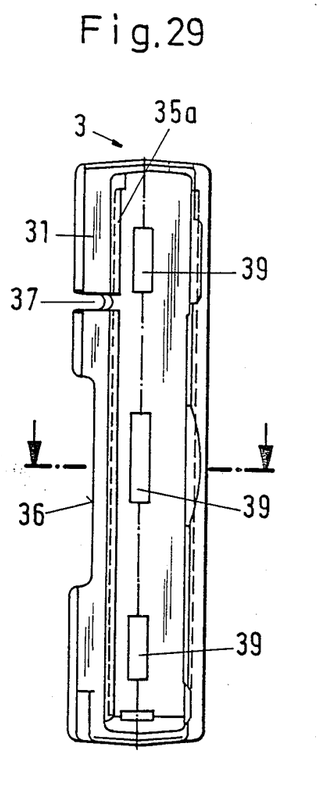
FIG. 29 is a side-elevational view of a side part having handle holes, as seen from the inside.
Figure 30:
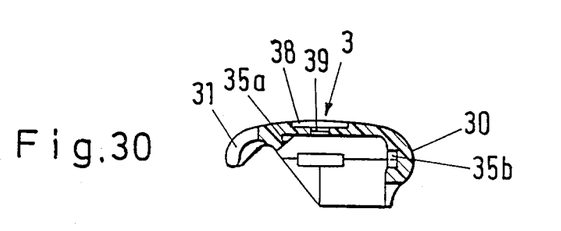
FIG. 30 is a cross-sectional view of a side part, taken along the section line in FIG. 29, in the direction of the arrows.
Figure 31:
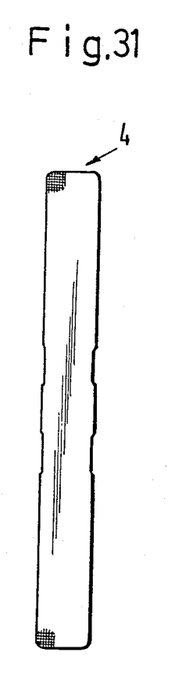
FIG. 31 is an elevational view of a retaining part as seen from the outside.
Figure 32:
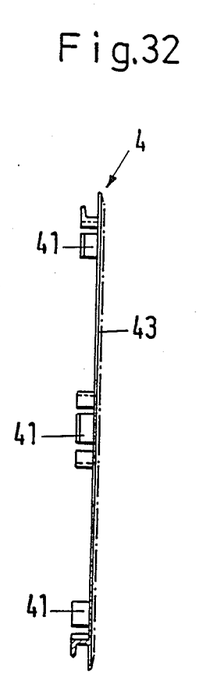
FIG. 32 is an elevational view of the retaining part of FIG. 31, rotated through 90 degrees.
Figure 33:
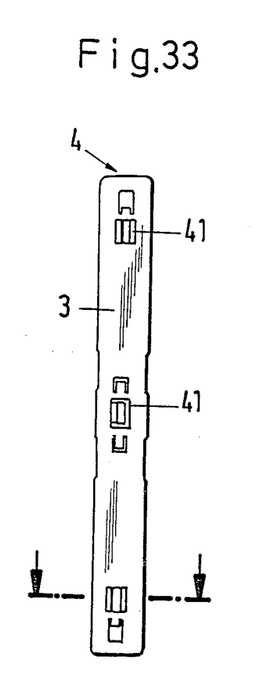
FIG. 33 is an elevational view of the retaining part, as seen from the inside.
Figure 34:
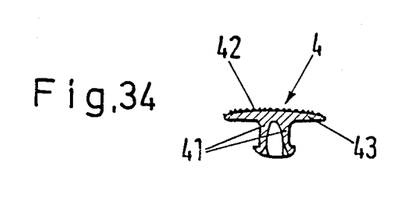
FIG. 34 is a cross-sectional view of the retaining part, taken along the section line of FIG. 33, in the direction of the arrows.

The supporting lower housing part 1b, without the sliding cap 5, is a frame element on the back 95 of which fixation ribs or fixation grooves 13 are again formed, corresponding to complementary fixation grooves and-/or fixation ribs on the inside of the side parts 3. Profiled depressions 11 with recesses 11a for the protecting ring of the test prods and recesses 11b for grasping the test prod are also provided in this case. An access hole 17 serves to loosen a clamping element 65, with the aid of which the sliding cap 5 is secured to the supporting lower housing part. Access to the clamping element 65 can be gained through the access hole 17 with a pointed tool, in order to open the sliding cap. As already described, the retaining holes 12 are formed by corresponding recesses 12a, 12b in the vicinity of the abutting edges 18 on the supporting upper and lower parts 1a, 1b of the housing. The two housing parts 1a, 1b are held together on one side by closing hooks 21, which engage complementary closing holes 22. On the opposite side, two screw holes 23 on the lower housing part are used for the insertion of connecting screws.

The foregoing is a description corresponding in substance to German Application No. P 36 11 067.1, dated Apr. 3, 1986, the International priority of which is being claimed for the instant application, and which is hereby made part of this application. Any material discrepancies between the foregoing specification and the aforementioned corresponding German application are to be resolved in favor of the latter.

We claim:

1. Housing for a portable measuring instrument, comprising inherently stable supporting housing parts formed of hard plastic, said supporting housing parts including a front and a back separate from said front each with relatively long right and left sides, relatively short sides and two opposite outer edges, an operating surface on said front, a display on said front, and operating elements on said front; and a flexible, frame-like shock protector discrete from said supporting housing parts in the form of two side parts formed of soft plastic integrated in the housing, said side parts protruding beyond all of said sides of said supporting housing parts and extending at said right and left sides between said front and back, means for permanently securing said side parts to said housing parts when the housing is assembled, each of said side parts including a bead being disposed at a respective one of said outer edges of said front for protecting said front including said display and said operating elements, said beads protruding along said long sides beyond said front, said beads and said operating surface together defining a recessed grip for accommodating the thumb of an operator of the instrument next to said operating elements.

2. Housing according to claim 1, wherein said side parts have inner surfaces facing toward said housing parts, and including at least one retaining plug integrally formed on each of said inner surfaces, the retaining plugs being engaged and anchored in retaining holes formed in said housing parts.

3. Housing according to claim 2, wherein said supporting housing parts are in the form of upper and lower housing parts with abutting edges, said retaining holes for receiving said retaining plugs are formed in the vicinity of said abutting edges between said upper and lower housing parts, and said retaining plugs include retaining heads for penetrating said retaining holes when said upper and lower housing parts are spaced apart, said retaining heads being fixed in position when the housing is closed.

4. Housing according to claim 1, wherein said side parts have handle holes formed therein, and including a retaining part formed of flexible hard plastic having detent ribs formed thereon penetrating said side parts in the vicinity of said handle holes and being anchored in retaining holes formed in said housing parts.

5. Housing according to claim 4, wherein said retaining part includes a cover plate having a lower surface on which said detent ribs are disposed and an upper surface having gripping nubs formed thereon, said cover plate being locked into a depression formed in one of said side parts.

6. Housing according to claim 1, wherein said back has profiled depressions formed therein parallel to said two side parts in the vicinity of said outer edges, said depressions having profiles adapted to the shape of test prods to be placed therein, and including flexible clamping straps protruding from said two side parts for fixing test prods placed thereon in said profiled depressions.

7. Housing according to claim 6, wherein said back has guide depressions formed therein adjoining said profiled depressions, each of said guide depressions being parallel to a respective one of said two side parts, for guiding a measuring line wound on the long side with a length being adapted to the circumference of the housing and for winding the line in a secure and non-slipping manner with the test prod in its detent position.

8. Housing according to claim 6, said clamping straps protrude beyond said housing parts on said back.

9. Housing according to claim 6, wherein said clamping straps protrude equally as far as said housing parts on said back, providing a foot for the housing to stand on.

10. Housing according to claim 6, including a sliding cap formed on said back between said profiled depressions, said sliding cap having an end and sliding rails extending parallel to said long sides, a sliding drawer opening toward said front when said sliding cap is pulled out, said sliding drawer coming to rest beneath said display when said sliding cap is closed, and a housing drawer on said end of said sliding cap opposite said sliding drawer being uncovered when said sliding cap is pulled out to the length of said sliding drawer, said housing drawer having an opening being accessible from said back.

11. Housing according to claim 10, wherein one of said drawers includes means for receiving at least one battery and the other of said drawers includes means for receiving at least one fuse, said sliding cap being in the form of closure plate in the vicinity of said housing drawer, and including a window disposed in said sliding cap opposite said fuse receiving means.

12. Housing according to claim 10, wherein said sliding cap includes an outer surface, and including a support strap having an upper end outwardly rotatably secured to said outer surface of said sliding cap, a support rib limiting the outward pivot angle of said support strap, said support strap coming to rest on said back in an indentation when pivoting inward, and snap elements locking said support strap when pivoting inward.

* * * * *